United States Patent
Polster et al.

(10) Patent No.: US 9,584,226 B2
(45) Date of Patent: Feb. 28, 2017

(54) OPTICAL RECEIVER WITH THRESHOLD CONTROL BLOCK

(71) Applicant: Commissariat a l'energie atomique et aux energies alternatives, Paris (FR)

(72) Inventors: Robert Polster, Saint Martin d'Hères (FR); José Luis Gonzalez Jimenez, Voreppe (FR)

(73) Assignee: Commissariat a l'energie atomique et aux energies alternatives (FR)

( * ) Notice: Subject to any disclaimer, the term of this patent is extended or adjusted under 35 U.S.C. 154(b) by 0 days.

(21) Appl. No.: 14/951,074

(22) Filed: Nov. 24, 2015

(65) Prior Publication Data
US 2016/0149648 A1    May 26, 2016

(30) Foreign Application Priority Data
Nov. 25, 2014   (FR) ...................... 1461432

(51) Int. Cl.
*H04B 10/06*    (2006.01)
*H04B 10/61*    (2013.01)
(Continued)

(52) U.S. Cl.
CPC ............ *H04B 10/616* (2013.01); *H03F 3/082* (2013.01); *H04B 10/541* (2013.01); *H04B 10/695* (2013.01); *H03F 2200/135* (2013.01)

(58) Field of Classification Search
CPC ..... H04B 10/695; H04B 10/616; H04B 10/69; H04B 10/60; H04B 10/66; H04B 10/541; H03F 2200/135; H03F 3/082
(Continued)

(56) References Cited

U.S. PATENT DOCUMENTS 4,479,266 A * 10/1984 Eumurian ............ H04B 10/695
                                                          327/72
4,528,601 A *  7/1985 Moriyama ............ G11B 5/035
                                                          360/46
(Continued)

OTHER PUBLICATIONS

Nakamura et al. "1.25-Gb/s Burst-Mode Receiver ICs With Quick Response for PON Systems", "Journal of Solid-State Circuits", Dec. 2005, pp. 2680-2688, vol. 40, No. 12, Publisher: IEEE: DOI: 10.1109/JSSC.2005.856582.

(Continued)

*Primary Examiner* — Hibret Woldekidan
(74) *Attorney, Agent, or Firm* — Kaplan Breyer Schwarz & Ottesen, LLP (57) ABSTRACT

The invention concerns an optical receiver comprising: a photodiode (102) coupled to the input of a trans-impedance amplifier (308) such that the trans-impedance amplifier receives the current ($I_{PD}$) of the photodiode; a first comparator (112) adapted to compare an output voltage ($V_{OUT}$) of the trans-impedance amplifier (308) with a threshold voltage ($V_{TH}$); and a threshold control block (314) for generating the threshold voltage ($V_{TH}$), wherein the threshold control block (314) comprises at least one capacitor coupled to the output (110) of the trans-impedance amplifier (308) via at least one switch.

15 Claims, 3 Drawing Sheets (51) Int. Cl.
  *H03F 3/08* (2006.01)
  *H04B 10/54* (2013.01)
  *H04B 10/69* (2013.01)

(58) Field of Classification Search
  USPC .................... 398/202, 208, 160, 164, 140
  See application file for complete search history.

(56) References Cited

U.S. PATENT DOCUMENTS

| | | | | |
|---|---|---|---|---|
| 5,307,196 | A * | 4/1994 | Kinoshita | H04B 10/695 327/63 |
| 7,058,315 | B2 * | 6/2006 | Brewer | H04L 25/062 370/286 |
| 7,394,996 | B2 * | 7/2008 | Duanmu | H04B 10/695 398/202 |
| 7,657,192 | B2 * | 2/2010 | Duanmu | H04B 10/695 398/202 |
| 7,920,798 | B2 * | 4/2011 | Wong | H03K 5/084 398/208 |
| 8,280,262 | B2 * | 10/2012 | Mouri | H04B 10/802 398/202 |
| 8,705,985 | B2 * | 4/2014 | Christensen | H04B 10/695 398/206 |
| 9,264,644 | B2 * | 2/2016 | Huang | H04N 5/378 |
| 2013/0108280 | A1 | 5/2013 | Azadeh et al. | |
| 2014/0029958 | A1 | 1/2014 | Takahashi et al. | |
| 2014/0299875 | A1 * | 10/2014 | Umezaki | G09G 3/325 257/43 |

OTHER PUBLICATIONS

French Search Report issued in French parent patent application No. 14/61432 on Jul. 27, 2015, Published in: FR.

Liu, et al., "10-Gbps, 5.3-mW Optical Transmitter and Receiver Circuits in 40-nm CMOS", "Journal of Solid-State Circuits", Sep. 2012, pp. 2049-2067, vol. 47, No. 9, Publisher: IEEE; DOI: 10.1109/JSSC.2012.2197234.

Nazari, et al., "A 24-Gb/s Double-Sampling Receiver for Ultra-Low-Power Optical Communication", "Journal of Solid-State Circuits", Feb. 2013, pp. 344-357, vol. 48, No. 2, Publisher: IEEE; DOI: 10.1109/JSSC.2012.2227612.

Georgas, et al., "A Monolithically-Integrated Optical Receiver in Standard 45-nm SOI", "Journal of Solid-State Circuits", Jul. 2012, pp. 1693-1702, vol. 47, No. 7, Publisher: IEEE; DOI: 10.1109/JSSC.2012.2191684.

* cited by examiner

OPTICAL RECEIVER WITH THRESHOLD CONTROL BLOCK

The present patent application claims the priority benefit of French patent application FR14/61432, filed Nov. 25,2014, the contents of which are incorporated herein by reference in its entirety to the maximum extent allowable by law.

FIELD

The present disclosure relates to the field of optical communications, and in particular to an optical receiver and to a method of calibrating an optical receiver.

BACKGROUND

Optical links provide high data transmission rates at low power, and thus present a viable solution for replacing ordinary copper interconnects between integrated circuits. Optical reception is based on capturing, using a photodiode, a light signal that is generally encoded in a digital fashion, and which may have a power level as low as 10 µW. The photosensitive device for example generates a small current that is transformed by the optical receiver into a digital voltage signal.

The power level of the received optical signal may vary in time, and therefore, in order to correctly receive the transmitted signal, calibration of the optical receiver is generally required. However, a problem with existing solutions for calibrating the optical receiver is that they tend to be complex and consuming in chip area and energy consumption, slow to converge to an appropriate level and/or overly influenced by the transmitted data signal.

United States patent application published under the number US2013/0108280 describes an optical receiver comprising a threshold detection circuit.

United States patent application published under the number US2014/0029958 describes a detecting apparatus including a threshold detection circuit that detects, by a switchable time constant, a threshold of a level of an input optical burst signal.

SUMMARY

It is an aim of embodiments of the present disclosure to at least partially address one or more problems in the prior art.

According to one aspect, there is provided an optical receiver comprising: a photodiode coupled to the input of a trans-impedance amplifier such that the trans-impedance amplifier receives the current of the photodiode; a first comparator adapted to compare an output voltage of the trans-impedance amplifier with a threshold voltage; and a threshold control block for generating the threshold voltage, wherein the threshold control block comprises at least one capacitor coupled to the output of the trans-impedance amplifier via at least one switch. The threshold control block for example comprises: a first capacitor coupled to a first node, the first node being coupled by a first switch to the output of the trans-impedance amplifier; a second capacitor coupled to a second node, the second node being coupled by a second switch to the output of the trans-impedance amplifier, a third switch being coupled between the first and second nodes; and a control circuit configured to control the first, second and third switches.

According to one embodiment, the threshold control block is adapted to generate the threshold voltage by:
individually controlling each of the first and second switches to sample the output voltage of the trans-impedance amplifier one or more times by controlling the first switch to couple the first capacitor to the output of the trans-impedance amplifier and controlling the second switch to couple the second capacitor to the output of the trans-impedance amplifier; and
closing the third switch such that the threshold voltage becomes equal to the average of the voltages held by the first and second capacitors.

According to one embodiment, the first capacitor has a capacitance within plus or minus 10 percent of the capacitance of the second capacitor.

According to one embodiment, the at least one capacitor of the threshold control block comprises: a first capacitor coupled to a first node, the first node being coupled by a first switch to the output of the trans-impedance amplifier; a second capacitor coupled to a second node, the second node being coupled by a second switch to the output of the trans-impedance amplifier, wherein a third switch is coupled between the first and second nodes; and a control circuit configured to control the first, second and third switches.

According to one embodiment, the control circuit is adapted, during a calibration phase of the optical receiver, to control the first switch to sample the output voltage of the trans-impedance amplifier at a first time instant and store the sampled voltage on the first capacitor, to control the second switch to sample the output voltage of the trans-impedance amplifier at a second time instant after the first time instant and store the sampled voltage on the second capacitor, and then to close the third switch such that the threshold voltage becomes equal to the average of the voltages held by the first and second capacitors.

According to one embodiment, during a calibration phase of the optical receiver, the photodiode receives an optical signal that is high for a first time period and low for a second time period before or after the first time period, the control circuit being configured to: close the first switch during the first time period to bring the voltage at the first node to the level of the output voltage of the trans-impedance amplifier and then open the first switch before the end of the first time period; and close the second switch during the second time period to bring the voltage at the second node to the level of the output voltage of the trans-impedance amplifier and then open the second switch before the end of the second time period.

According to one embodiment, during a calibration phase of the optical receiver, the photodiode receives an optical signal that alternates between high and low levels with a period $t_P$, and the control circuit being configured to: control the first switch to sample the output voltage of the trans-impedance amplifier at a first time instant; and control the second switch to sample the output voltage of the trans-impedance amplifier at a second time instant, the first and second time instants being separated by a time interval equal to $(N+0.5)t_P$, where N is a positive integer.

According to one embodiment, the threshold control block further comprises: a fourth switch coupled between the output of the trans-impedance amplifier and an intermediate node; a fifth switch coupled between the intermediate node and the first node; and a sixth switch coupled between the intermediate node and the second node.

According to one embodiment, the control block is further adapted to control, during a period of data transmission, the fourth, fifth and sixth switches to couple the output of the trans-impedance amplifier to the first and second nodes.

According to one embodiment, the first comparator has a first input coupled to the output of the trans-impedance amplifier and a second input coupled to the second node, the optical receiver further comprising: a second comparator having a first input coupled to the output of the trans-impedance amplifier and a second input coupled to the first node.

According to a further aspect, there is provided an optical transmission system comprising: the above optical receiver; and an optical transmitter configured to generate, during a calibration phase of the optical receiver, an optical signal that alternates between high and low levels.

According to a further aspect, there is provided a method of calibrating a threshold voltage of a first comparator of an optical receiver, the method comprising: converting, by a trans-impedance amplifier, the current of a photodiode into an output voltage; and generating, by a threshold control block, a threshold voltage, the threshold control block comprising at least one capacitor coupled to the output of the trans-impedance amplifier via at least one switch. The threshold control block for example comprises a first capacitor coupled to a first node, the first node being coupled by a first switch to the output of the trans-impedance amplifier; a second capacitor coupled to a second node, the second node being coupled by a second switch to the output of the trans-impedance amplifier, a third switch being coupled between the first and second nodes; and a control circuit configured to control the first, second and third switches.

According to one embodiment, generating the threshold voltage comprises controlling the at least one switch to sample the output voltage of the trans-impedance amplifier one or more times.

According to one embodiment, the threshold voltage is generated during a calibration phase of the optical receiver during which the photodiode receives an optical signal that is high for a first time period and low for a second time period before or after the first time period, and generating the threshold voltage comprises: closing a first switch, coupled via a first node to a first capacitor, during the first time period to bring the voltage at the first node to the level of the output voltage of the trans-impedance amplifier; opening the first switch before the end of the first time period; closing a second switch, coupled via a second node to a second capacitor, during the second time period to bring the voltage at the second node to the level of the output voltage of the trans-impedance amplifier; and opening the second switch before the end of the second time period.

According to one embodiment, the threshold voltage is generated during a calibration phase of the optical receiver during which the photodiode receives an optical signal that alternates between high and low levels with a period $t_P$, and generating the threshold voltage comprises: controlling a first switch, coupled via a first node to a first capacitor, to sample the output voltage of the trans-impedance amplifier at a first time instant; and controlling a second switch, coupled via a second node to a second capacitor, to sample the output voltage of the trans-impedance amplifier at a second time instant, wherein the first and second time instants are separated by a time interval equal to $(N+0.5)t_P$, where N is a positive integer.

According to one embodiment, generating the threshold voltage further comprises, after the first and second time instants: controlling a third switch to couple together the first and second nodes.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present description, the term "connected" is used to designate a direct connection between two elements, whereas the term "coupled" is used to designate a connection between two elements that may be direct, or may be via one or more other components such as resistors, capacitors or transistors. Furthermore, as used herein, the term "substantially" is used to designate a range of +/−10 percent of the value in question.

Figure 1:
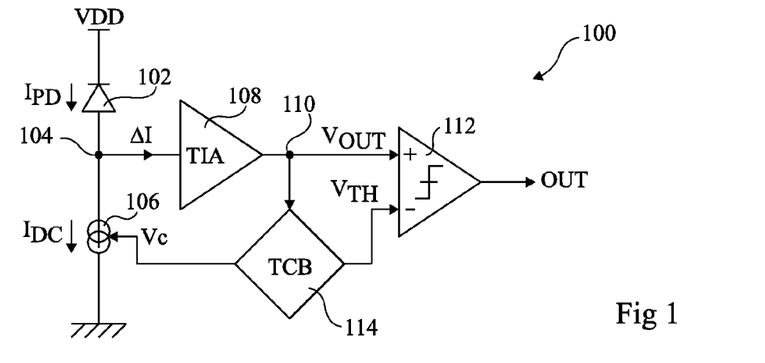
FIG. 1 schematically illustrates an example of an optical receiver having a variable current source.

FIG. 1 schematically illustrates an optical receiver 100. An optical receiver having many features in common with the optical receiver 100 of FIG. 1 is described in the publication by M. Nakamura et al. entitled "1.25-Gb/s Burst-Mode Receiver ICs With Quick Response for PON Systems", IEEE Journal of Solid-State Circuits, Vol. 40, No. 12, December 2005.

The optical receiver 100 comprises a photodiode 102 having its cathode coupled to a supply voltage VDD, and its anode coupled to a node 104. The photodiode 102 is biased by a variable current source 106, which is coupled between the node 104 and ground, and conducts the DC portion $I_{DC}$ of the photodiodes output signal $I_{PD}$. The node 104 is also coupled to the input of a trans-impedance amplifier (TIA) 108. In particular, the TIA receives the current difference ΔI between the current $I_{PD}$ conducted by the photodiode 102 and the current $I_{DC}$ conducted by the variable current source 106.

The output 110 of the TIA 108 is coupled to the positive input of a comparator 112, which is for example a sense amplifier. The negative input of the comparator 112 is coupled to a threshold control block (TCB) 114, which generates a threshold voltage $V_{TH}$ provided to the comparator 112. An input of the TCB 114 is coupled to the output 110 of the TIA 108. The TCB 114 also provides a control voltage $V_C$ to the variable current source 106.

Operation of the circuit of FIG. 1 will now be described with reference to the timing diagram of FIG. 2.

Figure 2:
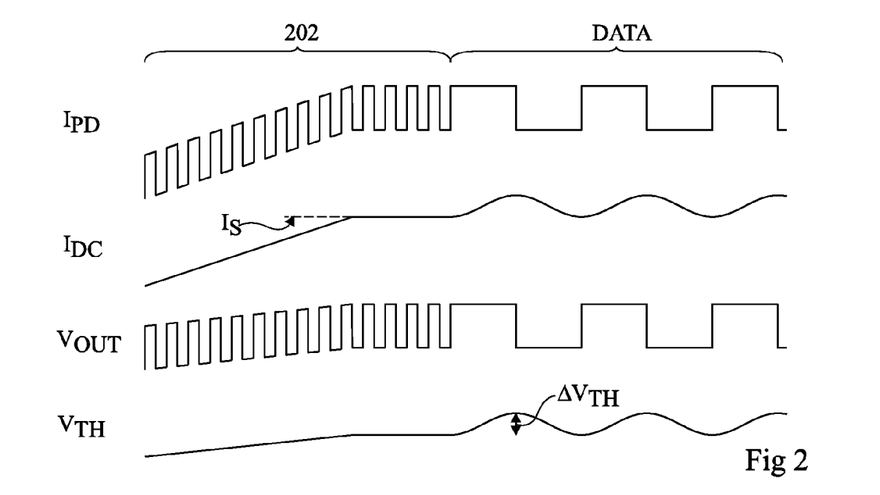
FIG. 2 is a timing diagram illustrating examples of signals in the circuit of FIG. 1.

FIG. 2 illustrates an example of the photodiode current $I_{PD}$, the current $I_{DC}$ conducted by the variable current source 106, the voltage $V_{OUT}$ at the output of the TIA 108, and the threshold voltage $V_{TH}$.

FIG. 2 illustrates a first data transmission phase 202 during which the optical signal transmitted to the optical receiver 100 alternates between high and low levels, and for example corresponds to a bit sequence "10101010101 . . . ". The current source 106 initially conducts a relatively low current, and the photodiode current, which has a square wave form corresponding to the transmitted optical signal, is thus also initially at a relatively low level. The output voltage $V_{OUT}$ of the TIA 108 is therefore initially also relatively low.

In the circuit of FIG. 1, the TCB 114 sets, using the control voltage $V_C$, the current $I_{DC}$ in order to bias the TIA 108 in a certain preferred operating range. Thus, in the example of FIG. 2, the TCB 114 for example controls the variable current source 106 in order to increase the photodiode current $I_{PD}$, and also to increase the biasing voltage of the TIA 108. The current $I_{DC}$ is for example increased until it converges to a level $I_S$ at which the output voltage $V_{OUT}$ of TIA 108 has reached a desired average level. The threshold voltage $V_{TH}$ is generated based on the output voltage $V_{OUT}$ of the TIA 108, and for example converges to a level $V_S$, which is around the mid-point between the high and low levels of the output voltage $V_{OUT}$.

The TCB 114 for example controls the levels of $I_{DC}$ and $V_{TH}$ using a low pass filter having a cut-off frequency such that the relatively high frequency transitions in the output voltage $V_{OUT}$ of the TIA 108, when corresponding to the transmitted data signal, are filtered out.

However, as presented on the right-hand side in FIG. 2, if during the subsequent data transmission phase the data signal comprises sequences of several 1's or 0's, this may cause the TCB 114 to shift the levels of the current $I_{DC}$ and of the threshold voltage $V_{TH}$. If the peak shift $\Delta V_{TH}$ in the threshold voltage $V_{TH}$ exceeds a certain level, this can cause errors in the decoding of the data signal by the comparator 112.

Thus, a problem is that, if the low-pass filter of the TCB 114 in the circuit of FIG. 1 has a relatively high cut-off frequency, the threshold voltage $V_{TH}$ is likely to drift when the data signal comprises sequences of a few 0's or 1's. Alternatively, if the low-pass filter of the TCB 114 has a relatively low cut-off frequency, the current $I_{DC}$ and threshold voltage $V_{TH}$ will be slow to stabilize at the levels $I_S$ and $V_S$ respectively.

In the document US2013/0108280 mentioned above in the background section, the detection circuit of the optical receiver has a first RC circuit, and a second RC circuit having a decreased time constant with respect to the first RC circuit. The first RC circuit is used for accuracy, whereas the second RC circuit allows the decision threshold voltage to decay at a faster rate. A drawback of the threshold detection circuit described in this document is that there is a trade-off between speed and accuracy. Indeed, choosing a relatively long time constant for the second RC circuit would result in a relatively accurate threshold voltage, but lead to a relatively long convergence time before the first RC circuit is activated. To increase the convergence speed, the second RC circuit could be configured to have a relatively low time constant. However, this will lead to the threshold decision voltage tracking the received optical signal. Thus, when the first RC circuit is activated, there will still be a delay before the signal converges to an accurate level.

In the document US2014/0029958 mentioned above in the background section, an automatic threshold control (ATC) circuit comprises a high-speed threshold detection circuit and a low-speed threshold detection circuit. The ATC of this document therefore suffers from the same drawbacks as the circuit of document US2013/0108280.

Figure 3:
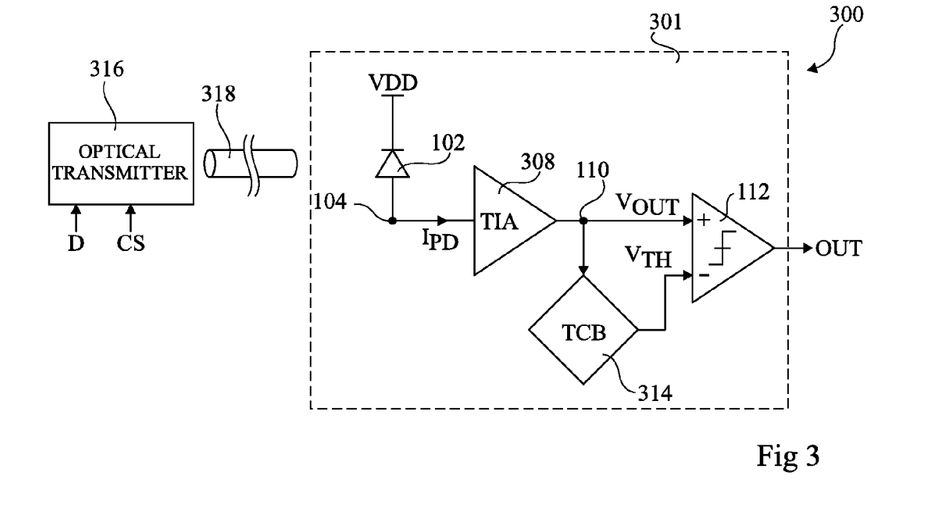
FIG. 3 schematically illustrates an optical transmission system according to an embodiment of the present disclosure.

FIG. 3 schematically illustrates an optical transmission system 300 comprising an optical receiver 301. Certain elements of the optical receiver 301 are identical to those of the optical receiver 100 of FIG. 1, and have been labelled with like reference numerals and will not be described again in detail.

In the optical receiver 301, rather than comprising the variable current source 106 to conduct the DC portion of the photodiode signal $I_{PD}$, the TIA 108 is replaced by a TIA 308, which conducts the entire photodiode current $I_{PD}$, in other words the DC portion $I_{DC}$ and AC portion $\Delta I$ of the photodiode signal. Thus, the node 104 is only coupled to the input of the TIA 308. Furthermore, the TCB 114 of FIG. 1 is replaced in FIG. 3 by a threshold control block 314 for generating the threshold voltage $V_{TH}$ of the comparator 112, and no longer generates the control voltage $V_C$ for controlling a variable current source.

The optical transmission system 300 of FIG. 3 also for example comprises an optical transmitter (OPTICAL TRANSMITTER) 316, which generates the optical signal. The optical signal is for example transmitted via an optical waveguide 318 to the photodiode 102 of the optical receiver 301. The distance separating the transmission and reception sides, and the length of the optical waveguide 318, will depend on the specific application, and could for example be only a few millimeters or much longer. One example application of the optical transmission system 300 is for data transmission between processor cores in a multi-core computing architecture.

The optical transmitter 316 for example receives the data signal D to be transmitted over the optical link, and a calibration signal CS to be transmitted over the optical link during one or more calibration phases of the optical receiver 301. The optical transmission system 300 is for example capable of data transmission at a bit rate of up to 10 Gb/s per comparator on the receive side.

Figure 4:
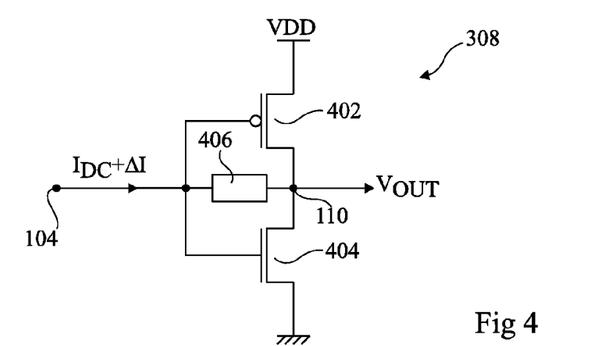
FIG. 4 schematically illustrates a trans-impedance amplifier of FIG. 3 in more detail according to an example embodiment.

FIG. 4 schematically illustrates the TIA 308 of FIG. 3 in more detail according to an example embodiment.

The TIA 308 for example comprises an inverter formed of transistors 402 and 404 coupled by their main conducting nodes between a supply voltage VDD and ground. The transistor 402 is for example a PMOS transistor, and the transistor 404 is for example an NMOS transistor. An intermediate node between the transistors 402, 404 corresponds to the output node 110 of the TIA 308 and provides the output voltage $V_{OUT}$. The node 110 is coupled via a resistor 406 to the input node 104 of the TIA 308. The input node 104 is also coupled to the control nodes of the transistors 402, 404.

In operation, the TIA 308 in FIG. 4 functions as a push-pull inverter with resistive feedback provided by the resistor 406. The DC part $I_{DC}$ of the input current is conducted by the resistor 406 and then by the transistor 404. The output voltage $V_{OUT}$ at the output node 110 of the TIA 308 is a function of the current signals $I_{DC}$ and $\Delta I$.

Figure 5:
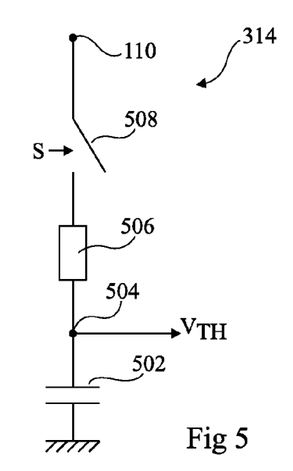
FIG. 5 schematically illustrates a threshold control block of FIG. 3 in more detail according to an embodiment of the present disclosure.
Figure 6:
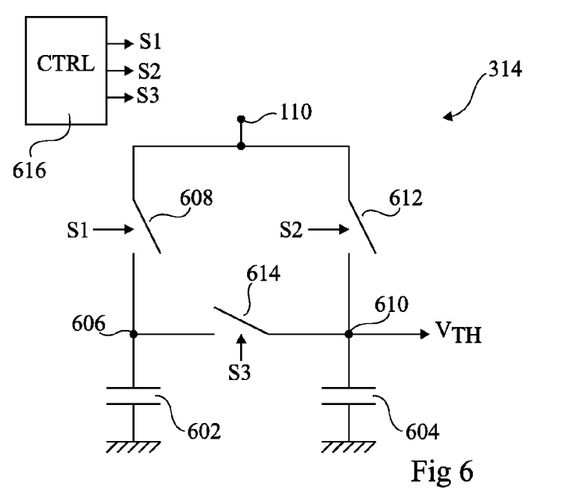
FIG. 6 schematically illustrates a threshold control block of FIG. 3 in more detail according to a further embodiment of the present disclosure.

FIGS. 5 and 6 schematically illustrate the TCB 314 of FIG. 3 in more detail according to alternative embodiments.

In the example of FIG. 5, the TCB 314 comprises a capacitor 502 coupled between ground and a node 504. The node 504 is in turn coupled to the output 110 of the TIA 308 via a resistor 506 and a switch 508 coupled in series. The switch 508 is controlled by a signal S.

In operation, the capacitor 502 and resistor 506 form an RC filter that is for example coupled to the output 110 of the TIA 308 only during a calibration phase of the optical receiver. For example, during the calibration phase, the optical transmitter 316 transmits a signal that alternates between high and low levels, for example at the bit rate such that the transmitted sequence is for example "101010101 010 . . . ". The resistance of resistor 506 and the capacitance of capacitor 502 are for example chosen such that the cut-off frequency of the filter is relatively high, and the voltage at the node 504 thus converges relatively rapidly to an average value between the high and low levels. The calibration phase can therefore be relatively short, and prior to the data transmission phase, the switch 508 is for example opened such that capacitor 502 is isolated from the output 110 of the TIA 308, and the threshold voltage $V_{TH}$ remains at a stable level.

In the example of FIG. 6, the TCB 314 comprises two capacitors 602 and 604, which for example have substantially the same capacitance as each other.

The capacitor 602 is coupled between ground and a node 606, which is in turn coupled to the output 110 of the TIA 308 via a switch 608 controlled by a signal S1. The capacitor 604 is coupled between ground and a node 610, which is in turn coupled to the output 110 of the TIA 308 via a switch 612 controlled by a signal S2. A switch 614 controlled by a signal S3 is coupled between the nodes 606 and 610. A control block (CTRL) 616 for example generates the signals S1, S2 and S3. The node 610 for example provides the threshold voltage $V_{TH}$.

In one example of operation of the circuit of FIG. 6, during the calibration phase, the optical transmitter 316 transmits a signal that is high for a time period corresponding to a plurality of binary ones and low for another time period corresponding to a plurality of binary zeros. These time periods could be in any order. During one of these time periods, the switch 608 is closed such that the voltage at the node 606 rapidly converges to a voltage level V0 corresponding to the binary zero level, and the switch 608 is then opened again to store this voltage at node 606. During the other of the time periods, the switch 612 is closed such that the voltage at node 610 rapidly converges to a voltage level V1 corresponding to a binary one level, and the switch 612 is then opened again to store this voltage at node 610. Thus each of the time periods is for example long enough for voltage across the capacitor 602 or 604 to settle at a level corresponding to the output voltage of the TIA. The switch 614 is then closed so that the voltage at the nodes 606, 610 equalizes to a level substantially halfway between V0 and V1.

An alternative operation of the circuit of FIG. 6 will now be described in more detail with reference to the timing diagram of FIG. 7.

Figure 7:
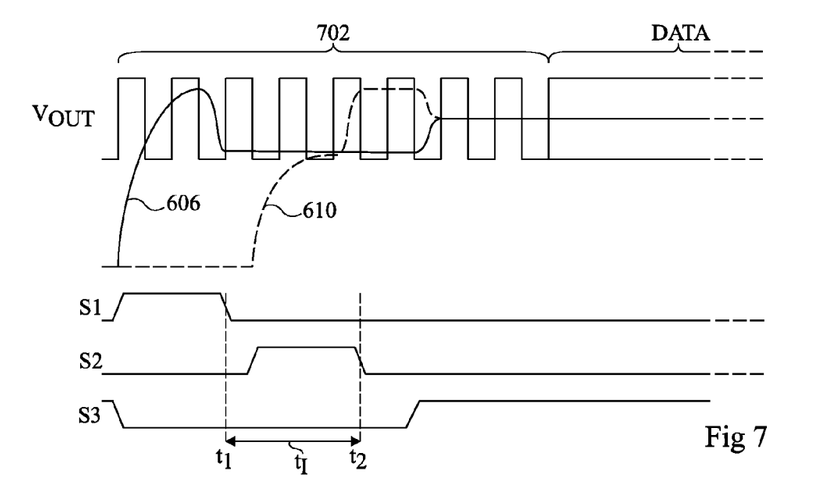
FIG. 7 is a timing diagram illustrating signals in the circuit of FIG. 6 according to an example embodiment.

FIG. 7 illustrates examples of the output voltage $V_{OUT}$ of the TIA 308, of the voltages at the nodes 606 and 610 respectively, and of the signals S1, S2 and S3.

During a calibration phase 702, a signal is for example transmitted by the optical transmitter 316, and thus the output voltage $V_{OUT}$ for example has a substantially square wave, in which each high and low pulse for example has a duration of a single bit.

Initially, the signal S1 is asserted, and the signals S2 and S3 are low, such that only the switch 608 is conducting. The switch 608 is for example dimensioned to provide an on resistance $R_{ON}$ such that, with the capacitor 602, an RC filter is formed. As shown by the solid-line curve 606 in FIG. 7, the time constant of this RC filter is such that the voltage at the node 606 rises relatively rapidly to the level of the voltage signal $V_{OUT}$, and then starts to oscillate with the signal $V_{OUT}$.

At a time instant t1, the signal S1 is brought low such that the switch 608 is opened. Thus the capacitor 602 is isolated from the output 110 of the TIA 308, and the voltage level stored by the capacitor 602 is held at the node 606.

The signal S2 is then asserted, such that only switch 612 is conducting. The switch 612 is for example dimensioned to provide an on resistance $R_{ON}$ such that, with the capacitor 604, an RC filter is formed. As shown by the dashed-line curve 606 in FIG. 7, the time constant of this RC filter is such that the voltage at the node 610 rises relatively rapidly to the level of the voltage signal $V_{OUT}$, and then starts to oscillate with the signal $V_{OUT}$.

At a time instant t2, the signal S2 is brought low such that the switch 612 is opened. Thus the capacitor 604 is isolated from the output 110 of the TIA 308, and the voltage level stored by the capacitor 604 is held at the node 610.

The signal S3 is then asserted such that the nodes 606 and 610 are coupled together, and the threshold voltage $V_{TH}$ becomes equal to the average of the voltages held by the capacitors 602 and 604. The switch 614 is for example dimensioned to provide a relatively rapid equalisation of the charges between the capacitors 602 and 604.

The time instants $t_1$ and $t_2$ are for example chosen to fall at points during the period of the voltage signal $V_{OUT}$ with a phase difference of 180°. In other words, the signal $V_{OUT}$ having a period of oscillation of $t_p$, the time instants t1 and t2 are for example separated by a time interval $t_I$ equal to $(N+0.5)t_p$, where N is a positive integer equal to 1 or more.

The voltage stored at the node 606 will have an unknown error with respect to the mid-voltage level between the high and low voltage levels of the signal $V_{OUT}$. However, the voltage stored at the node 610 will have the same magnitude of error as the voltage at node 606, but the opposite sign. Therefore, by averaging the charge held by each capacitor, the errors will cancel, and the resulting voltage at the nodes 606 and 610 will equal the mid-voltage level between the high and low voltage levels of the signal $V_{OUT}$.

In the example of FIG. 7, the time instants $t_1$ and $t_2$ are aligned with the bit transitions of the signal $V_{OUT}$, but that is merely one option, and the time instants could fall at another time. Indeed, it is only the relative timing of $t_1$ and $t_2$ that matters.

Furthermore, while in the embodiment of FIG. 7 the signal S2 is brought high only after the signal S1 has gone low, in alternative embodiments, the signal S2 could go high at the same time as the signal S1, or at any time while S1 is high. However, the falling edges of the signals S1 and S2 for example remain spaced apart by the interval $t_I$.

Figure 8:
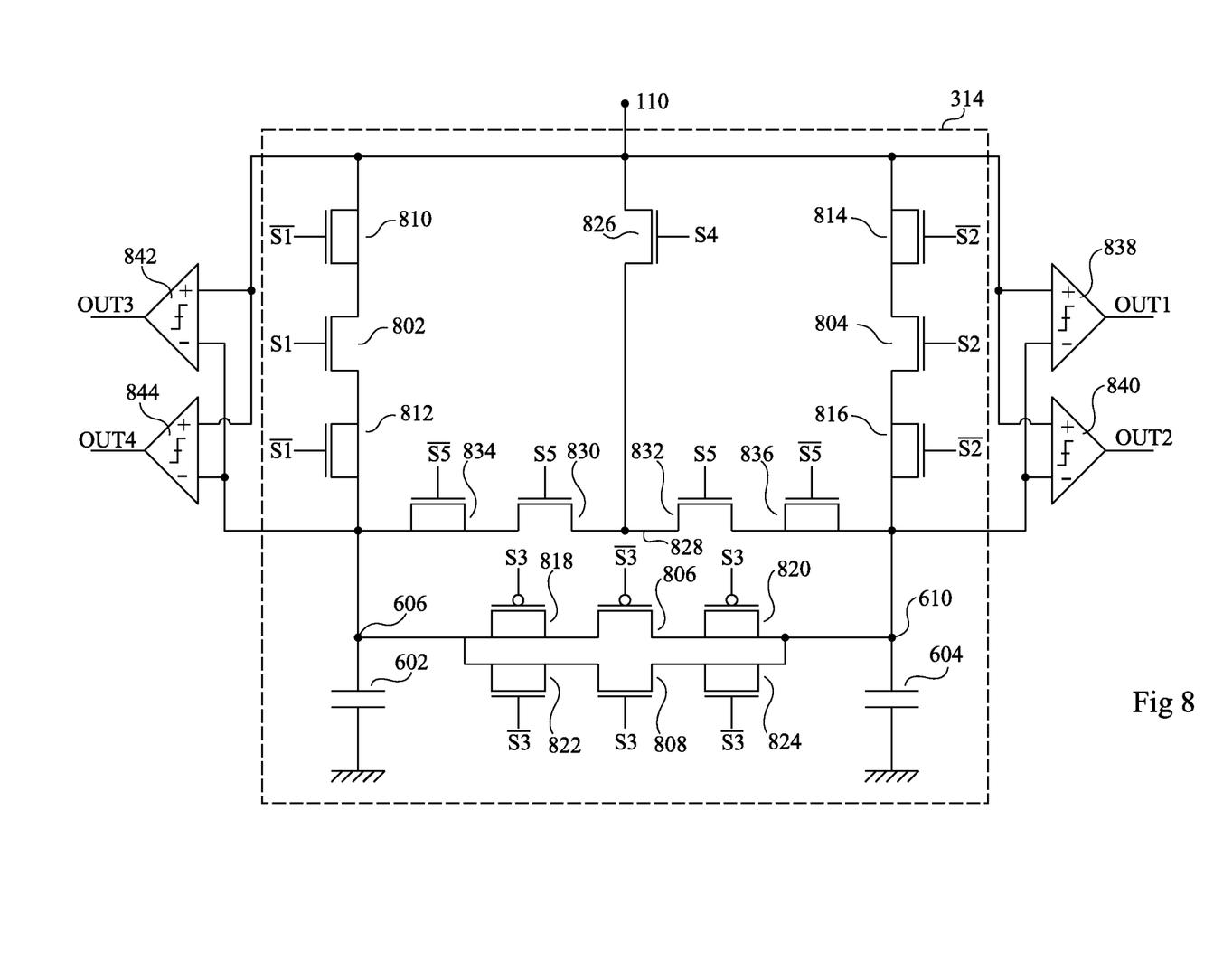
FIG. 8 schematically illustrates the threshold control block of FIG. 6 in more detail according to an example embodiment.

FIG. 8 schematically illustrates the TCB 314 of FIG. 6 in more detail according to an example embodiment.

The TCB 314 for example comprises an NMOS transistor 802 implementing switch 608 and controlled at its gate by the signal S1, and an NMOS transistor 804 implementing the switch 612 and controlled at its gate by the signal S2. The switch 614 is for example implemented by a PMOS transistor 806 controlled at its gate by the inverse $\overline{S3}$ of the signal S3 and an NMOS transistor 808 controlled at its gate by the signal S3, the transistors 806 and 808 being coupled in parallel with each other between the nodes 606, 610.

In some embodiments, additional transistors, each having its source and drain connected together, are included to provide compensation for clock feed through. For example, NMOS transistors 810 and 812 are coupled on either side of the transistor 802, and are controlled at their gates by the inverse $\overline{S1}$ of the signal S1. Similarly, NMOS transistors 814 and 816 are for example coupled on either side of the transistor 804, and are controlled at their gates by the inverse $\overline{S2}$ of the signal S2. PMOS transistors 818 and 820 are for example coupled on either side of the transistor 806, and are controlled at their gates by the signal S3. NMOS transistors 822 and 822 are for example coupled on either side of the transistor 808, and are controlled at their gates by the inverse $\overline{S3}$ of the signal S3.

The circuit of FIG. 8 also for example comprises three switches respectively formed by an NMOS transistor 826 coupled between the output 110 of the TIA 308 and an intermediate node 828 and controlled at its gate by a signal S4, an NMOS transistor 830 coupled between the intermediate node 828 and the node 606 and controlled at its gate by a signal S5, and an NMOS transistor 832 coupled between the intermediate node 828 and the node 610 and also controlled at its gate by the signal S5. In some embodiments, the transistors 830 and 832 also comprise clock feed through compensation provided by NMOS transistors 834 and 836 each having its source and drain connected together, and each being controlled at its gate by the inverse $\overline{S5}$ of the signal S5. The transistor 834 is for example coupled between the transistor 830 and the node 606, and the transistor 836 is for example coupled between the transistor 832 and the node 610.

In operation, the signals S4 and S5 are for example asserted by the control block 616 of FIG. 6 during a data transmission phase in order to compensate for gradual drift in the power of the transmitted optical signal. For example, this gradual drift is the result of gradual temperature changes, the activation or deactivation of neighboring circuits, and/or of laser power fluctuations. The transistors 830 and 832 for example provide a certain resistance, which when combined with the capacitances of the capacitors 602 and 604 provide an RC filter having a relatively low cut-off frequency.

FIG. 8 also illustrates an example in which there are a total of four comparators 838, 840, 842 and 844, which for example operate in a time-interleaved fashion, allowing the transmission bit rate of the optical link to be increased by a factor of four with respect to using a single comparator. The comparators 838 and 840 for example each have their positive input coupled to the output 110 of the TIA 308, and their negative input coupled to the node 610. The comparators 842 and 844 for example each have their positive input coupled to the output 110 of the TIA 308, and their negative input coupled to the node 606. Of course, in alterative embodiments, more comparators could be used to increase even more the transmission bit rate, or only the comparators 838 and 842 could be used in order to double the transmission data rate with respect to a single comparator.

An advantage of the embodiments described herein is that they provide a solution of relatively low complexity for rapid calibration of the threshold voltage of the comparator of the optical receiver. Furthermore, by using the two capacitor solution of FIG. 6, accurate calibration can be performed particularly rapidly, for example using as few as 6 calibration bits.

Having thus described at least one illustrative embodiment, various alterations, modifications and improvements will readily occur to those skilled in the art.

For example, it will be apparent to those skilled in the art that the supply voltage VDD in the various embodiments could be at any level, for example between 1 and 3 V, and that, rather than being at 0 V, the ground voltage can also be considered as a supply voltage that could be at any level, such as a negative level.

Furthermore, it will be apparent to those skilled in the art that, in any of the embodiments described herein, some or all of the NMOS transistors could be replaced by PMOS transistors and/or some or all of the PMOS transistors could be replaced by NMOS transistors. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. The optical receiver comprising:
a photodiode coupled to the input of a trans-impedance amplifier such that the trans-impedance amplifier receives the current of the photodiode;
a first comparator adapted to compare an output voltage of the trans-impedance amplifier with a threshold voltage; and
a threshold control block for generating the threshold voltage, wherein the threshold controls block comprises:
a first capacitor coupled to a first node, the first node being coupled by a first switch to the output of the trans-impedance amplifier;
a second capacitor coupled to a second node, the second node being coupled by a second switch to the output of the trans-impedance amplifier, wherein a third switch is coupled between the first and second nodes; and
a control circuit configured to control the first, second and third switches.

2. The optical receiver of claim 1, wherein the threshold control block is adapted to generate the threshold voltage by individually controlling each of the first and second switches to sample the output voltage of the trans-impedance amplifier one or more times, and closing the third switch such that the threshold voltage becomes equal to the average of the voltages held by the first and second capacitors.

3. The optical receiver of claim 1, wherein the first capacitor has a capacitance within plus or minus 10 percent of the capacitance of the second capacitor.

4. The optical receiver of claim 1, wherein the control circuit is adapted, during a calibration phase of the optical receiver, to control the first switch to sample the output voltage of the trans-impedance amplifier at a first time instant and store the sampled voltage on the first capacitor, to control the second switch to sample the output voltage of the trans-impedance amplifier at a second time instant after the first time instant and store the sampled voltage on the second capacitor, and then to close the third switch such that the threshold voltage becomes equal to the average of the voltages held by the first and second capacitors.

5. The optical receiver of claim 1, wherein, during a calibration phase of the optical receiver, the photodiode receives an optical signal that is high for a first time period and low for a second time period before or after the first time period, and wherein the control circuit is configured to:
close the first switch during the first time period to bring the voltage at the first node to the level of the output voltage of the trans-impedance amplifier and then open the first switch before the end of the first time period; and close to the second switch during the second time period to bring the voltage at the second node to the level of the output voltage of the trans-impedance amplifier and then open the second switch before the end of the second time period.

6. The optical receiver of claim 1, wherein, during a calibration phase of the optical receiver, the photodiode receives and optical signal that alternates between high and low levels with a period $t_P$, and wherein the control circuit is configured to:
control the first switch to sample the output voltage of the trans-impedance amplifier at a first time instant; and
control the second switch to sample the output voltage of the trans-impedance amplifier at a second time instant, wherein the first and second time instants are separated by a time interval equal to $(N+0.5)t_P$, where N is a positive integer.

7. The optical receiver of claim 1, wherein the threshold control block further comprises:
a fourth switch coupled between the output of the trans-impedance amplifier and an intermediate node;
a fifth switch coupled between the intermediate node and the first node; and
a sixth switch coupled between the intermediate node and the second node.

8. The optical receiver of claim 7, wherein the control block is further adapted to control, during a period of data transmission, the fourth and sixth switches to coupled the output of the trans-impedance amplifier to the first and second nodes.

9. The optical receiver of claim 1, wherein the first comparator has a first input coupled to the output of the trans-impedance amplifier and a second input coupled to the second node, the optical receiver further comprising:
a second comparator having a first inout coupled to the output of the trans-impedance amplifier and a second input coupled to the first node.

10. An optical transmission system comprising:
the optical receiver of claim 1; and
an optical transmitter configured to generate, during a calibration phase of the optical receiver, an optical signal that alternates between high and low levels.

11. A method of calibrating a threshold voltage of a first comparator of an optical receiver, the method comprising:
converting, by a trans-impedance amplifier, the current of a photodiode into an output voltage; and
generating, by a threshold control block, a threshold voltage wherein the threshold control block comprises:
a first capacitor coupled to a first node, the first node being coupled by a first switch to the output of the trans-impedance amplifier;
a second capacitor coupled to a second node, the second node being coupled by a second switch to the output of the trans-impedance amplifier, wherein a third switch is coupled between the first and second nodes; and
a control circuit configured to control the first, second and third switches.

12. The method of claim 11, wherein generating the threshold voltage comprises controlling the first and second switches to sample the output voltage of the trans-impedance amplifier one or more times.

13. The method of claim 11, wherein the threshold voltage is generated during a calibration phase of the optical receiver during which the photodiode receives an optical signal that is high for a first time period and low for a second time period before or after the first time period, and generating the threshold voltage comprises:
closing a first switch, coupled via a first node to a first capacitor during the first time period to bring the voltage at the first node to the level of the output voltage of the trans-impedance amplifier
opening the first switch before the end of the first time period;
closing a second switch, coupled via a second node to a second capacitor, during the second time period to bring the voltage at the second node to the level of the output voltage of the trans-impedance amplifier; and
opening the second switch before the end of the second time period.

14. The method of claim 11, wherein the threshold voltage is generated during a calibration phase of the optical receiver during which the photodiode receives an optical signal that alternates between high and low levels with a period $t_P$, and generating the threshold voltage comprises:
controlling a first switch, coupled via a first node to a first capacitor, to sample the output voltage of the trans-impedance amplifier at a first time instant; and
controlling a second switch coupled via a second node to a second capacitor, to sample the output voltage of the trans-impedance amplifier at a second time instant, wherein the first and second time instants are separated by a time interval equal to $(N0.5)t_P$, where N is a positive integer.

15. The method of claim 13, wherein generating the threshold voltage further comprises, after the first and second time instants:
controlling a third switch to couple together the first and second nodes.

* * * * *